(12) United States Patent
Boer et al.

(10) Patent No.: US 12,713,553 B2
(45) Date of Patent: Aug. 18, 2026

(54) METHOD AND DEVICE FOR INDIRECT COOLING OF HEAT SOURCES OF A SYSTEM COMPONENT OF A VISUALIZATION SYSTEM

(71) Applicant: Schölly Fiberoptic GmbH, Denzlingen (DE)

(72) Inventors: Pascal Boer, Freiburg (DE); Mateusz Cichosz, Freiburg (DE); Raffael Stratz, Freiburg (DE); Eugen Möhlinger, Friesenheim (DE); Alexander Köhler, Freiburg (DE)

(73) Assignee: Schölly Fiberoptic GmbH, Denzlingen (DE)

( * ) Notice: Subject to any disclaimer, the term of this patent is extended or adjusted under 35 U.S.C. 154(b) by 381 days.

(21) Appl. No.: 18/497,210

(22) Filed: Oct. 30, 2023

(65) Prior Publication Data

US 2024/0164047 A1 May 16, 2024

(30) Foreign Application Priority Data

Nov. 15, 2022 (DE) ......................... 102022130235.0

(51) Int. Cl.
*H05K 7/20* (2006.01)
*H04N 23/52* (2023.01)

(52) U.S. Cl.
CPC ......... *H05K 7/20136* (2013.01); *H04N 23/52* (2023.01); *H05K 7/202* (2013.01); *H05K 7/20218* (2013.01); *H05K 7/2039* (2013.01)

(58) Field of Classification Search
CPC .......... F21V 29/51; F21V 29/83; F21V 29/74; F21V 23/008; F21V 29/50; F21V 29/67; F21V 29/70; G06F 1/20; G06F 2200/201; G06F 1/206; H05K 7/2039; H05K 7/20172; H05K 7/206; H05K 7/20154; H05K 1/0201; H05K 1/0203; H05K 2201/10106;

(Continued)

(56) References Cited

U.S. PATENT DOCUMENTS 5,986,882 A * 11/1999 Ekrot ................. H05K 7/20809 361/679.48
9,453,638 B2 * 9/2016 Fiederling ............... F21V 21/00

(Continued)

FOREIGN PATENT DOCUMENTS

CN 217659773 U 10/2022
DE 102017007198 A1 2/2019

*Primary Examiner* — Michael A Matey
(74) *Attorney, Agent, or Firm* — Volpe Koenig

(57) ABSTRACT

For increasing the operational reliability of a system component such as a light source unit or a camera control unit of a visualization system, waste heat produced by at least one heat source, which is arranged in an interior of the system component that is closed off to the outside, preferably so as to be air-tight, is transported by a cooling line, which is arranged in the interior and is filled with coolant, and/or by using an internal air circulation effected with appropriately, to a primary heat sink arranged in the interior, and the waste heat is then released from the interior to the outside through the primary heat sink using heat conduction. An efficient cooling of the at least one heat source can be achieved thereby; in addition, the heat source remains largely protected from external ambient influences, in particular it remains protected against dust.

16 Claims, 4 Drawing Sheets

(58) Field of Classification Search
CPC .. H05K 5/00; H05K 5/06; H05K 7/20; H05K 7/20136; H05K 7/20145; H05K 7/202; H05K 7/20336; H05K 7/20409; H05K 7/20418; H05K 7/207; H05K 7/20736; H05K 7/20754; H05K 7/209; H05K 7/20909; F21K 9/00; F21K 9/232; F21S 43/14; F21S 45/47; F28D 15/0275; F28F 3/02; G03B 21/16; H04N 23/52
See application file for complete search history.

(56) References Cited

U.S. PATENT DOCUMENTS 10,349,561 B2* 7/2019 Farshchian ......... F28D 15/0266
11,116,050 B1* 9/2021 Bhogal ................ H05B 6/6447
11,454,537 B2* 9/2022 Su ......................... G01J 1/0252
2005/0117294 A1* 6/2005 Hsieh ........................ G06F 1/20 361/695
2006/0087810 A1* 4/2006 Rockenfeller ............ G06F 1/20 165/104.33
2007/0268666 A1* 11/2007 Yang ...................... G03B 21/16 361/695
2009/0044928 A1* 2/2009 Upadhya ............... F28F 19/006 165/81
2009/0067129 A1* 3/2009 Shen ........................ H05K 7/20 361/691
2009/0154102 A1* 6/2009 Zhou ..................... H01L 23/427 361/709
2011/0108250 A1* 5/2011 Horng ....................... G06F 1/28 165/121
2011/0228470 A1* 9/2011 Chang ....................... G06F 1/20 361/679.47
2011/0285267 A1* 11/2011 Lu ........................... F21V 29/76 313/46
2014/0321056 A1* 10/2014 Yoshikawa ........ H05K 7/20818 361/690
2015/0062803 A1* 3/2015 Lin .................... H05K 7/20772 361/679.47
2015/0195952 A1* 7/2015 Tsunoda .................. G06F 1/203 361/690
2016/0282152 A1* 9/2016 Khen ........................ G01T 1/20
2017/0176605 A1* 6/2017 Bouhnik ................... G01T 7/00
2019/0237386 A1* 8/2019 Knauer ............... F28D 15/0266
2020/0077543 A1* 3/2020 Chen .................. H05K 7/20727
2021/0149463 A1* 5/2021 Lu ...................... H05K 7/20154
2022/0312633 A1* 9/2022 Zhang ................ H05K 7/20163
2023/0247805 A1* 8/2023 Ma ..................... H05K 7/20809 361/679.47

* cited by examiner

METHOD AND DEVICE FOR INDIRECT COOLING OF HEAT SOURCES OF A SYSTEM COMPONENT OF A VISUALIZATION SYSTEM

CROSS-REFERENCE TO RELATED APPLICATIONS

This application claims priority to German Patent Application No. 10 2022 130 235.0, filed Nov. 15, 2022, which is incorporated herein by reference as if fully set forth.

TECHNICAL FIELD

The invention relates to a system component of a visualization system, thus for example a camera control unit or a light source unit. With the visualization system, an object can be observed and visualized, in particular in medical applications. Such a visualization system may be designed in particular as a video endoscopy system or, for example, as a microscope system or as an exoscope system.

The invention further relates to a method for indirectly cooling at least one heat source of a system component as described above, and to a specific use of an internal air circulation, in particular with the aim of cooling a multiplicity of electronic devices of a system component as described above.

The invention relates to a novel cooling solution for cooling electronics or other electrical heat sources located in an interior of a system component such as a camera control unit (CCU). The solution according to the invention can also be used, for example, for a light source which is configured as part of a visualization system like the CCU, wherein the light sources of the light source unit then form the heat sources to be cooled.

BACKGROUND

In the prior art, numerous approaches for enabling such cooling are already known. In particular, fans are often used, which cause an ambient air flow to the heat sources to be cooled, so that the ambient air which passes over the heat sources is heated and thus removes waste heat/power loss from the electronic components. In such a configuration, however, it is detrimental that particles such as dust particles can enter the interior of the system component and can deposit there on light sources or electronic devices.

SUMMARY

Proceeding from this, the invention is based on the object of providing an improved cooling solution. In particular, the electrical failure safety should be maintained despite efficient cooling and a complex decontamination avoided as far as possible.

To achieve this object, one or more of the features disclosed herein are provided in a system component of the type mentioned in the introductory part. In particular, to achieve the object in a system component which comprises at least one heat source generating waste heat during operation, and which is designed as part of an (in particular medical) visualization system, it is thus proposed according to the invention that the at least one heat source is arranged in an interior closed off to the outside, preferably so as to be air-tight, which is (at least partially) enclosed and/or delimited by a housing of the system component. Furthermore, to achieve the object, it is proposed to arrange in the interior a fan with which an internal air circulation within the closed-off interior can be effected/generated. This internal air circulation can circulate, for example, vertically and/or horizontally in the interior.

By closing off the interior with the aid of the housing, the ingress of dust and dirt into the interior can be reduced to a level sufficient for the application. Depending on the application, it can be non-critical here if, for example, a small exchange of air with the interior is possible at some points through holes or slots or the like. This can even be advantageous, for example to facilitate opening and closing of the interior. Specifically if contamination of the interior is to be safely avoided, however, an air-tight closure can be useful. If smaller openings are formed in the housing, they should be arranged/designed in such a way that the internal air circulation is not disturbed by larger ingress of air from the outside. The interior can thus be closed in particular to such a degree that a direct ingress of dust into the interior and/or a direct outflow of the air circulation to the outside is avoided.

For example, the (interior) fan may have rotating fan blades that cause air circulation. However, a fan within the meaning of the invention can also be designed to be rotorless, for which solutions are known in the prior art. For the purposes of the invention, however, other ventilation means which do not necessarily have to have movable parts, but which can generate air circulation in the interior are technically equivalent to this.

The interior may preferably be designed to be accessible from the outside, for example by way of the housing of the system component not being completely closed, but designed to be openable. In this way, the interior is in principle accessible for maintenance or repair purposes, for example, but can then be closed off to be air-tight again in order thus to prevent the ingress of dust and/or pathogens.

The provision of an interior which is closed off so as to be air-tight thus has the advantage that dust can no longer be deposited in the interior, in particular on electronic devices. This can prevent both electrical short circuits and heat build-up (hot spots). In addition, the devices in the interior do not have to be disinfected with great effort if the system component has been used in a medical procedure in which pathogens were contained in the ambient air of the operating theater.

By means of the fan arranged in the interior, which can in particular be a secondary fan (that is to say, in addition to a further primary fan of the system component), an air circulation in the interior can be generated which can be used for cooling the at least one heat source. The air flow circulating in the interior/the internal air circulation can thus absorb waste heat/power loss from the at least one heat source, whereby the air flow/the internal air in the interior is heated. The thus heated internal air can then be conducted to an inner side of a primary heat sink owing to the air circulation effected, where it in turn releases the absorbed waste heat to the primary heat sink. The primary heat sink can absorb the waste heat contained in the internal air and release it via heat conduction to its outer side, which may be in contact with the ambient air. With this mechanism, the primary heat sink can thus release waste heat from the interior to the outside air without endangering the air tightness of the interior. In other words, the invention thus proposes to transport the waste heat from the at least one heat source through the primary heat sink from the interior to the outside into the surrounding area by means of heat conduction. It is not necessary here to provide a primary fan for cooling the outer side of the primary heat sink; in the simplest case, the primary heat sink can be cooled on the outer side by heat convection. Furthermore, a fluid cooling, in particular a water cooling, of the primary heat sink can also be configured.

Alternatively or in addition to the features of claim 1, the features of the coordinate device claim 2 may also be provided for achieving the object mentioned in the introductory part. In particular, to achieve the object in a system component of the type mentioned in the introductory part according to the invention, having at least one heat source that generates waste heat during operation, it is thus possible for provision to be made for the at least one heat source to be arranged in an interior closed off to the outside, preferably so as to be air-tight (this interior may also be delimited/enclosed, for example, by a housing of the system component), and for at least one cooling line filled with coolant to be arranged in the interior with which the at least one heat source can be cooled. In this case, the coolant may be present in the cooling line, for example in the solid state, outside normal operation and become liquefied as it heats up only during operation, and later also transition to the gaseous state. In other words, at least one of the heat sources located in the interior can thus be in direct thermal contact with the cooling line. The object is further achieved in that the at least one cooling line ends at or in a primary heat sink, wherein just one inner side of the primary heat sink delimits (or helps to delimit) the interior.

In contrast to previously known concepts, the cooling line should thus not be led out of the interior, but at best end in a wall of the interior. So provision may be made in particular for the at least one cooling line to not completely penetrate a wall of the interior into the surrounding area.

Thus, it is suggested in particular that a liquid cooling circuit constructed by means of the cooling line is completely arranged within the interior. According to this technical understanding, the interior can then also include all bodies that form an inner wall of the interior (such as said primary heat sink).

Again, in other words, the cooling line should thus first release its heat to the primary heat sink, and the latter transfers the heat outward onto the outer side of the primary heat sink, which can be in contact with the outside/ambient air. For example, configurations are also possible in which heat from the primary heat sink is removable on the outer side by means of fluid cooling, in particular water cooling.

Although the respective cooling line may be inserted into the primary heat sink, it preferably does not penetrate to the outside and is therefore definitely not in contact with the external surrounding area. This concept therefore amounts to indirect cooling of the cooling line, since it cannot release the heat to the surrounding area itself but only by means of a further heat sink, in particular the aforementioned primary heat sink, which absorbs the waste heat transported by the cooling line and transports it further to the outside (by means of heat conduction through the heat sink).

The at least one heat source can comprise preferably at least one electronic device, which can be cooled directly with the described cooling line. This means that the at least one cooling line can be thermally coupled to the device, in particular by direct connection to the device or to a heat sink, which in turn is thermally connected to the device.

Further advantageous embodiments of the system component will be described below, which are also reproduced in the dependent claims:

For example, the system component can be designed as a camera control unit. In this case, the at least one heat source may comprise numerous electronic components, in particular electronic devices.

Alternatively, a system component can be designed within the meaning of the invention, but also, as an example, as a light source unit. In this case, the at least one heat source comprises at least one light source (wherein this light source during operation then also generates a waste heat to be removed).

In the simplest case, the primary heat sink mentioned above may be formed by the housing of the system component.

In order to implement the solution according to the invention, it is therefore particularly advantageous if the system component comprises an, in particular the, primary heat sink described above, which is in contact on its outer side with external ambient air and whose inner side can be impacted by the internal air circulation, which can be effected with said fan in the interior.

In other words, an inner side of the primary heat sink can thus be arranged in the interior and/or an outer side of the primary heat sink can be arranged outside the interior. If, for example, the primary heat sink is formed by the housing of the system component, this housing is in contact on the outer side with the ambient air and can thus release waste heat from the interior to the surrounding area via said outer surface.

By the internal air circulation impacting on the primary heat sink, heat which is removed from the at least one heat source by means of the internal air circulation can be released to the primary heat sink. The primary heat sink thus cools the air circulation, absorbing waste heat in the process, and can pass it on to its outer side, where the primary heat sink in turn can release the waste heat to the outside/ambient air (outside the housing). The primary heat sink thus releases the heat to the surrounding area, wherein the waste heat from the interior is transported via heat conduction through the primary heat sink from the inside to the outside.

In order to render the heat conduction from the interior to the outside as efficient as possible, it is advantageous if the primary heat sink is made of a thermally conductive material, preferably of metal, in particular of aluminum.

A particularly advantageous configuration makes provision for the system component to comprise a cooling tunnel. This cooling tunnel can have an inflow opening for introducing ambient air and an outflow opening for discharging the ambient air. The ambient air flowing into the cooling tunnel can heat up at the primary heat sink and thus flow out of the outflow opening as heated ambient air. The primary heat sink may be formed in particular as part of the cooling tunnel. For example, an outer side of the primary heat sink may form an inner wall of the cooling tunnel (as a whole or in part).

Preferably, the cooling tunnel has its own fan, which can be regarded as a primary fan if a secondary fan is used in the interior. The fan/primary fan of the cooling tunnel allows ambient air to be conveyed through the cooling tunnel; for this purpose, the fan can draw in the ambient air and/or actively convey it out of the cooling tunnel to the outside (i.e., expel the ambient air from the cooling tunnel). This allows a continuous flow of ambient air to flow through the cooling tunnel. In other words, the primary fan may thus bring about a continuous ambient air flow that flows through the cooling tunnel and cools an outer side of the primary heat sink.

Said cooling tunnel can be designed in various alignments/arrangements: Thus, the cooling tunnel may be arranged, for example, in the interior of a housing of the system component, in particular in the form of a ventilation chimney or, for example, be mounted on an outer side of the housing of the system component. The ambient air flow through the cooling tunnel can flow, for example, horizontally or vertically in the specific application situation/installation situation (i.e. during the use of the system component).

If a primary fan is used to ventilate the cooling tunnel with ambient air, the fan arranged in the interior can be understood to be a secondary fan, which only causes the internal air circulation. Here, configurations where primary and secondary fans are driven by a common drive motor are also possible; for example, by using a common fan axis, which is guided in an air-tight manner through the boundary of the interior to the outside.

In the simplest case, the primary heat sink may be formed, for example, by a wall of the cooling tunnel. In this case, the outer side of the primary heat sink thus forms the inner wall of the cooling tunnel. The inner side of the primary heat sink, i.e. in this case the outer side of the wall of the cooling tunnel, can, by contrast, be in contact with the interior so that the internal air circulation can impact the inner side of the primary heat sink.

In the application situation, i.e. when the system component is in use, the cooling tunnel can be designed in almost any alignment. Thus, the cooling tunnel can be aligned horizontally, or for example chimney-like, so that the ambient air flow then flows from bottom to top (or vice versa) through the cooling tunnel, or, for example, also extend at an angle to the horizontal and/or vertical.

The cooling tunnel can also be arranged within the housing or, for example, also laterally with respect to the housing of the system component. The cooling tunnel can also form the housing of the system component.

According to a further configuration, a heat exchanger through which ambient air can flow can be formed or arranged in the cooling tunnel. Preferably, this heat exchanger may be formed as a honeycomb structure, so that a large surface is available for releasing waste heat to the ambient air flowing through the cooling tunnel.

The heat exchanger can thus provide a heat exchange surface for releasing heat to an ambient air flow, in particular to the aforementioned ambient air flow which flows through the cooling tunnel. This heat exchange surface may have a geometry which is optimized for efficient heat release, wherein numerous possible configurations are known in the prior art for this purpose, in particular using fins.

Configurations are preferred in which the heat exchanger has cooling elements, for example in the form of cooling fins or cooling walls, which serve to increase the surface area (e.g. in comparison to the surface of the inner wall of the cooling tunnel without the use of a heat exchanger), in order thus to release heat efficiently to the ambient air flow. Said heat exchange surface can form the outer side of the primary heat sink (as a whole or in part).

The heat exchanger may also be in thermal contact with the primary heat sink, thus in particular with a wall of the cooling tunnel. This allows heat to be transferable efficiently from the primary heat sink to the heat exchanger by means of heat conduction.

The heat exchange surface area can be a multiple of (10× or even 50× more than) a purely geometric inner surface area of the cooling tunnel. As a result, the release of heat to the ambient air flow can be made much more efficient.

It is understood that the honeycombs or longitudinal fins of the heat exchanger should be advantageously designed such that air can flow through the heat exchanger along its entire length. Since these structures demand volume, a cross section of the heat exchanger through which ambient air can flow will usually be smaller than the inner cross section of the cooling tunnel.

The primary heat sink (it is also possible, of course, for a plurality of such primary heat sinks to be formed) may have heat elements on the inner side, preferably in the form of heat fins or cold sinks. These heat elements can protrude into the interior and thus bring about an increase in surface area. This allows heat from the interior air to be efficiently absorbed by the primary heat sink. Here it is advantageous if said heat elements are aligned in the direction of the internal air circulation. In this case, the air circulation is disturbed as little as possible, and the internal air from the interior that passes by the heat elements can nevertheless release its heat to the heat elements and thus to the primary heat sink. Said heat elements thus enable an efficient heat transfer from the circulating internal air to the primary heat sink.

In order to improve the heat exchange, so-called thermal conductive pads may also be provided, which are mounted between a cooling line (heat pipe) used in the interior and the primary heat sink. Alternatively or in addition to this, a thermal conductive paste can be applied in each case to the same locations in order to reduce the heat transfer resistance and thus facilitate the heat exchange.

In general, heat can be transferred not only through heat conduction, because, owing to air inclusions in contact locations (in particular owing to real surface roughnesses), some of the heat can also be transferred through heat flow via the air in the inclusions. This is also referred to as combined heat transfer mechanisms.

On the outer side, the primary heat sink may have cooling elements, preferably in the form of cooling fins. These cooling elements can come into contact with the ambient air and bring about an increase in surface area. This allows heat from the primary heat sink to be efficiently released to the ambient air. For example, the cooling elements can radiate the heat to be removed into the surrounding area. For example, if the primary heat sink is provided by the housing of the system component, these cooling elements may be mounted on the outer side of the housing.

According to a preferred configuration, the cooling elements on the outer side of the primary heat sink are arranged in the cooling tunnel. In such a case, it is preferred if the cooling elements are aligned in the direction of the ambient air flow through the cooling tunnel. This way, the ambient air flow is disturbed as little as possible.

Said system component can—regardless of whether it is designed as a camera control unit or as a light source unit—comprise at least one electronic device. This at least one electronic device can be arranged in the interior and be thermally connected (directly) to an inner side of the primary heat sink by means of at least one cooling line filled with coolant.

In other words, provision may thus be made for at least one cooling line that is filled with coolant and transfers or can transfer waste heat from an electronic device directly to an inner side of the primary heat sink to be arranged in the interior.

The cooling lines described so far can have or form a capillary structure in their respective interiors. This allows the coolant in the cooling line to flow through the cooling line independently (due to the capillary effect) when the heat source to be cooled/the electronic device mentioned heats up, thus transporting waste heat from the heat source/the device to the primary heat sink.

The use of such cooling lines is suitable in particular for cooling devices with high electrical power loss (for example, of >1 watt per device). These devices can be considered to be devices of the first category.

Said system component may further comprise at least one electronic device, which is arranged in the interior and on which at least one cooling element which protrudes into the interior is mounted. The cooling element mounted on the device can thus absorb waste heat generated in the interior of the electronic device and release it to the air circulating in the interior. Also for this purpose it is advantageous if the(se) heat sink(s) arranged on the device is/are aligned in the direction of the internal air circulation.

These heat sinks can thus interact with the air flow circulating in the interior (internal air circulation) and thus efficiently transfer/release the waste heat of the device to the circulating interior air. Such configurations are suitable for cooling devices with medium power loss (e.g. <1 W but>100 mW per device) (electronic devices of the second category).

The system component may also comprise at least one electronic device, in particular a plurality of at least ten or at least twenty electronic devices, which is/are arranged in the interior, wherein the internal air circulation is aligned such that the air circulation impacts this device/these devices (directly). Such a configuration is suitable for cooling devices with low power loss (e.g. <100 mW/device) (electronic devices of the third category). These devices can therefore interact directly with the circulating internal air flow via their respective device surface and release heat to the internal air in the interior. A further heat dissipation mechanism used may be that waste heat from these devices is removed via heat conduction through an electronic circuit board (circuit board is used as a “heat spreader”), on which these devices are arranged. For this purpose, the electronic circuit board may also have metallic heat removal lines. This already offers considerable advantages over mere heat convection which would occur without the use of an internal air circulation (imparted by a fan) when the devices heat up.

In order for these third-category devices to be able to be cooled efficiently, it is therefore advantageous if the (inner/secondary) fan is aligned in such a way that the internal air circulation directly strikes these devices. If, for example, the third-category devices are arranged on a common electronic circuit board, it is advantageous if the circulating internal air flows over a major part (at least 50%) of the surface of this electronic circuit board, respectively with respect to a lower or upper side of the electronic circuit board. However, depending on the distribution of the power loss over the various heat sources, the circulating internal air can also be focused on a few thermally interesting heat sources, so that a much smaller area of the electronic circuit board is then actively cooled with the air flow.

Finally, the system component may also comprise at least one electronic device, in particular a multiplicity of at least ten or at least twenty electronic devices, which are not actively being impacted by the internal air flow. These devices of the fourth category are then cooled, for example, only by means of heat convection and/or heat conduction.

All the aforementioned electronic devices (of the first to fourth categories) can thus be understood as heat sources within the meaning of the invention.

A further configuration proposes that at least one air guide element, in particular in the form of an air deflector plate or air deflector blade, is arranged in the interior. This air guide element can be static or movable. The air guide element can also protrude into the interior and steer the internal air circulation. In particular, such an air guide element can accelerate the internal air circulation toward the primary heat sink.

Alternatively or in addition to this, the air circulation can thereby also be steered more precisely in the interior by virtue of the fact that at least two fans are arranged in the interior, which are spaced apart from one another and together generate the air circulation.

Configurations in which the at least one air guide element divides the interior into two subspaces, for example, a first subspace and a second subspace, are preferred. A plurality of heat sources in the form of electronic devices may be disposed in the first subspace provided within the interior. By contrast, an inner side of the primary heat sink may be disposed in the second subspace formed within the interior. Provision may also be made alternatively or in addition for at least two spaced-apart fans to be provided in the interior to generate the air circulation.

In this respect, one configuration proposes that the interior is divided into two subspaces, in particular by inserting an air guide element as described above, wherein the two subspaces are connected to each other/communicate with each other via the air circulation. This configuration can preferably be such that in a second subspace, in particular in the aforementioned second subspace in which an inner side of the primary heat sink is arranged, a second flow velocity of the internal air circulation prevails, which is higher than a first flow velocity of the internal air circulation, which prevails in a first subspace, in particular, in the aforementioned first subspace. Here, the plurality of heat sources to be cooled are located in the first subspace.

The features of the two independent method claims are provided according to the invention in order to achieve the stated object. In particular, it is thus proposed according to the invention in order to achieve the object in a method of the type described in the introductory part that an interior of the system component in which the at least one heat source is arranged is closed off, preferably so as to be air-tight, and that an internal air circulation is generated (in particular in addition to an already existing internal air convection due to heating of the at least one heat source). Appropriate means such as a fan can be used for this purpose. In the method, provision is thus made for the internal air circulation to circulate only within the closed-off interior and to transport in the process waste heat from the at least one heat source to an inner side of a primary heat sink. In this case, said inner side of the primary heat sink is arranged in the interior and is thus in contact with the internal air circulation.

In this method, the internal air circulation can flow through the interior in any direction. Flow directions down, up, or even horizontal or oblique flow directions can be realized. In order for the cooling of the at least one heat source to function efficiently, it is advantageous, however, if a closed air circulation is generated, which proceeds from the heat source to be cooled to the primary heat sink and from there back to the heat source.

As an alternative to the features described above, a method according to the invention for indirectly cooling at least one heat source of a system component as described above may also be characterized by the following features: To achieve the object, provision may be made for an interior of the system component in which the at least one heat source is arranged to be closed off, preferably so as to be air-tight, and for waste heat from the at least one heat source to be removed by means of a cooling line filled with coolant only up to a primary heat sink. This means that the cooling line should end up just in the primary heat sink, but not go beyond it. This is because the waste heat can then be removed, or dissipated, from the closed-off interior to the outside by means of the primary heat sink using heat conduction. It is therefore precisely dispensable that the cooling line is led out of the interior, which considerably simplifies the design of the system component.

In general, the idea of the invention, as described herein, can also be described as the use of an internal air circulation, which is used to cool a multiplicity of electronic devices of a system component of a visualization system. As has been the case already in the aforementioned methods, the system component may also be configured in this specific use according to any of the claims directed to such a component and/or as previously described.

When using the internal air circulation in this way in accordance with the invention, provision is now made in order to achieve the object for the air circulation to circulate only within an interior of the system component that is closed off, preferably so as to be air-tight, with the electronic devices being arranged in this interior. Furthermore, provision is made for these devices to be directly cooled with the internal air circulation by being directly impacted by the air circulation and/or (that is, in addition or alternatively to this) via cooling elements attached to the respective device, which in turn interact with the air circulation.

If used in this way, it is advantageous according to the invention if additionally waste heat from further electronic devices with a higher power loss is removed by means of a respective cooling line filled with coolant to a primary heat sink, with the primary heat sink delimiting the interior (as a whole or in part).

If used in this way, provision may thus be made for the waste heat of all electronic devices which are located in the interior to be removed from the closed-off interior to the outside with the aid of the primary heat sink by means of heat conduction. In other words, the invention thus proposes, among other things, to first transport (to be specific either by heat transfer by means of a coolant or by heat transfer via an internal air circulation) the waste heat from the respective electronic device to the (in particular respectively assigned) primary heat sink in different ways (depending on the category of the electronic device) and then, after it has been absorbed by the primary heat sink, to remove the waste heat to the outside through the primary heat sink by heat conduction.

Since in electronic circuit boards there are typically a high number of electronic devices of the second and third categories, i.e. of medium or low power loss, provision may be made according to the invention for these devices to be not cooled via separate cooling lines, but by means of the internal air circulation.

In this case, the electronic devices of the second and third categories, which are not cooled via separate cooling lines, but by means of the internal air circulation, can make up a proportion of 20-40%, or even a majority (>50%), of the total power loss in watts of the system component, which must be removed in the form of waste heat. It is understood that the primary heat sink mentioned above can absorb heat from the air circulation and remove it to the outside even when the air circulation is used in this way, since the inner side of the primary heat sink can also be in contact with the air circulation in this case.

BRIEF DESCRIPTION OF THE DRAWINGS

The invention will now be described in more detail on the basis of exemplary embodiments, but is not restricted to these exemplary embodiments. Further developments of the invention can be obtained from the following description of a preferred exemplary embodiment in conjunction with the general description, the claims, and the drawings.

In the following description of various preferred embodiments of the invention, elements that correspond in terms of their function are denoted by corresponding reference numerals, even in the case of a deviating design or shape.

In the figures:

Figure 1:
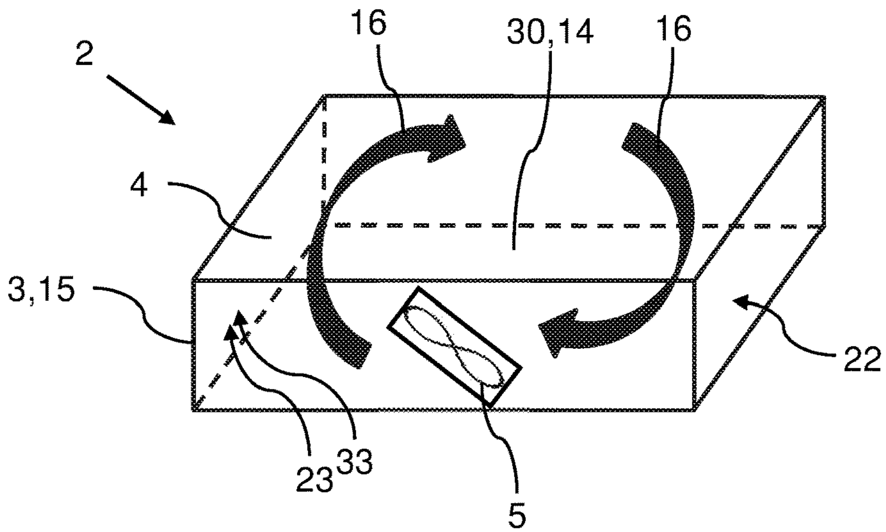
Figure 2:
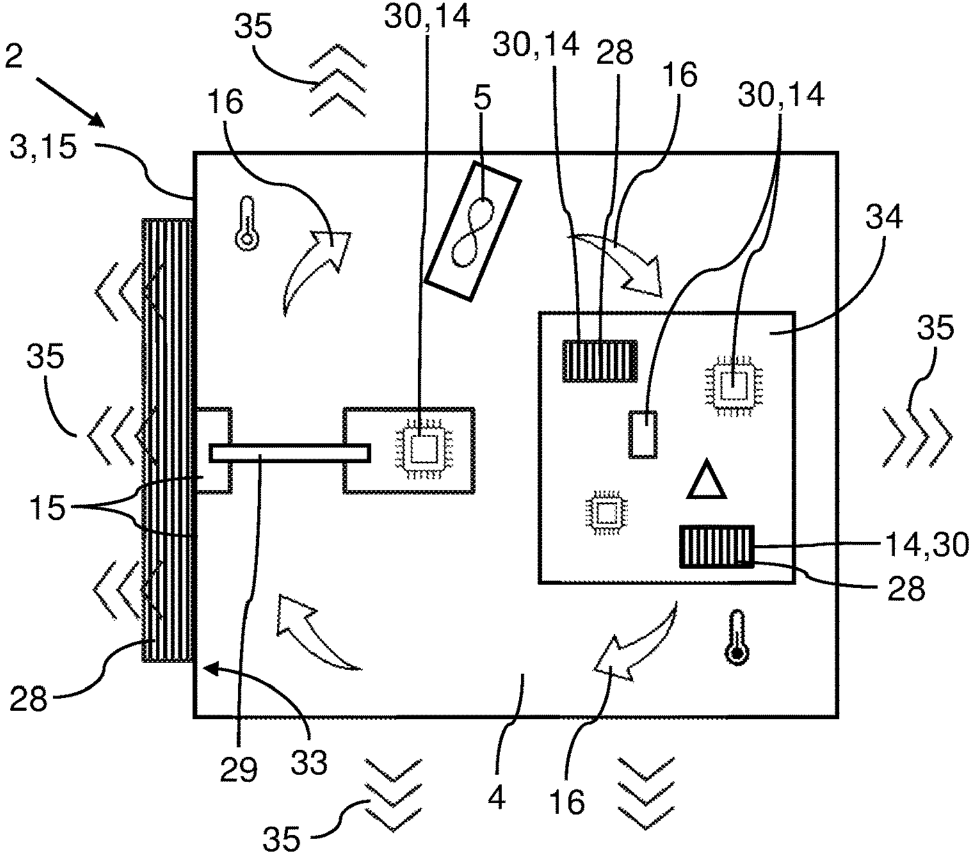
Figure 3:
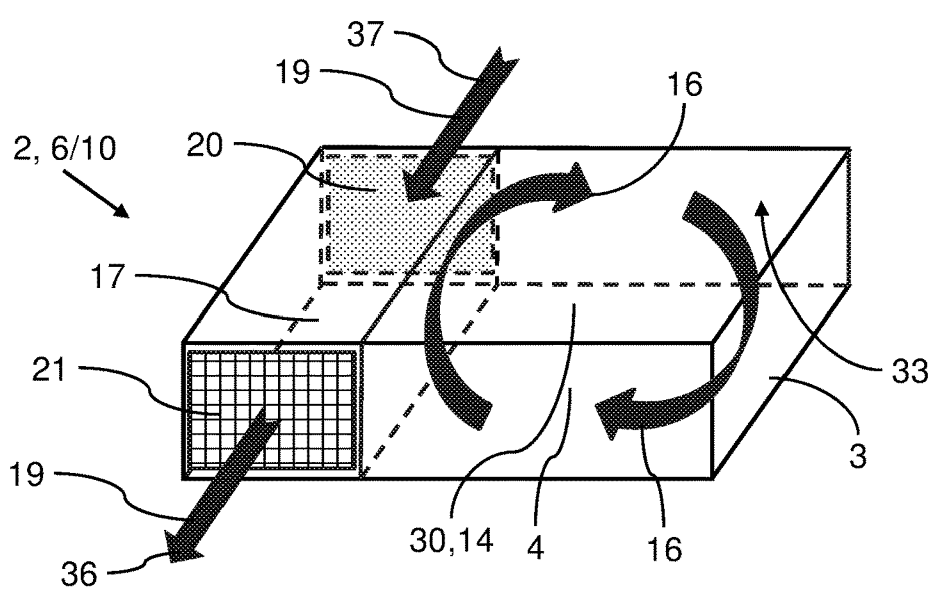
Figure 4:
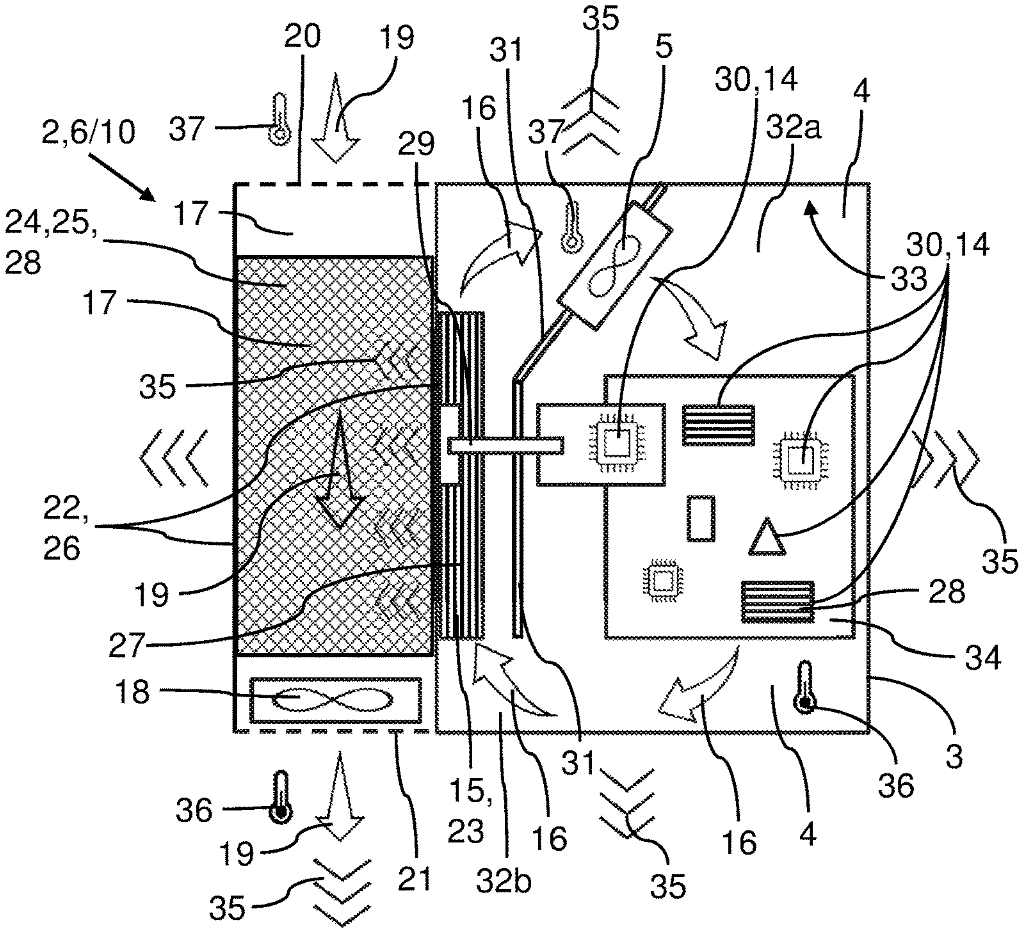
Figure 5:
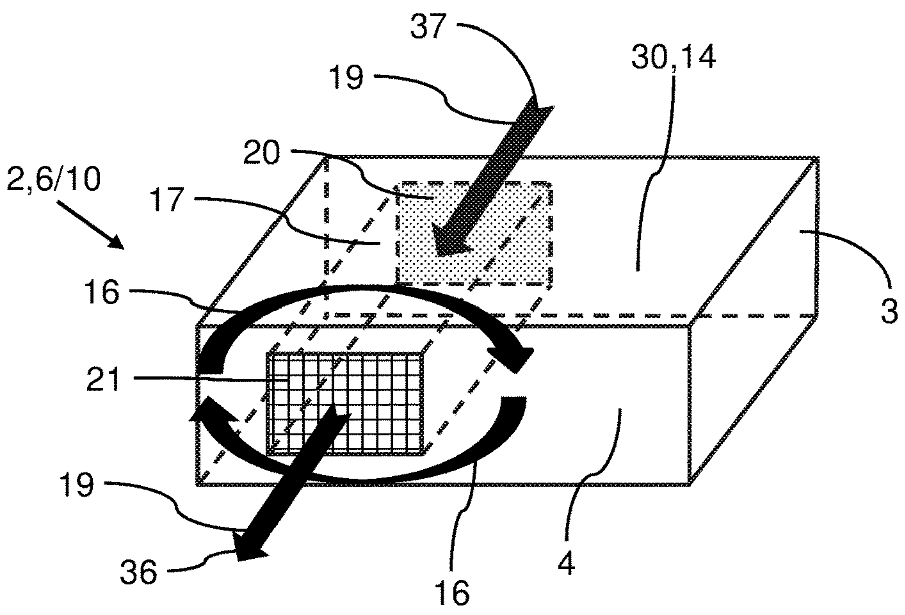
Figure 6:
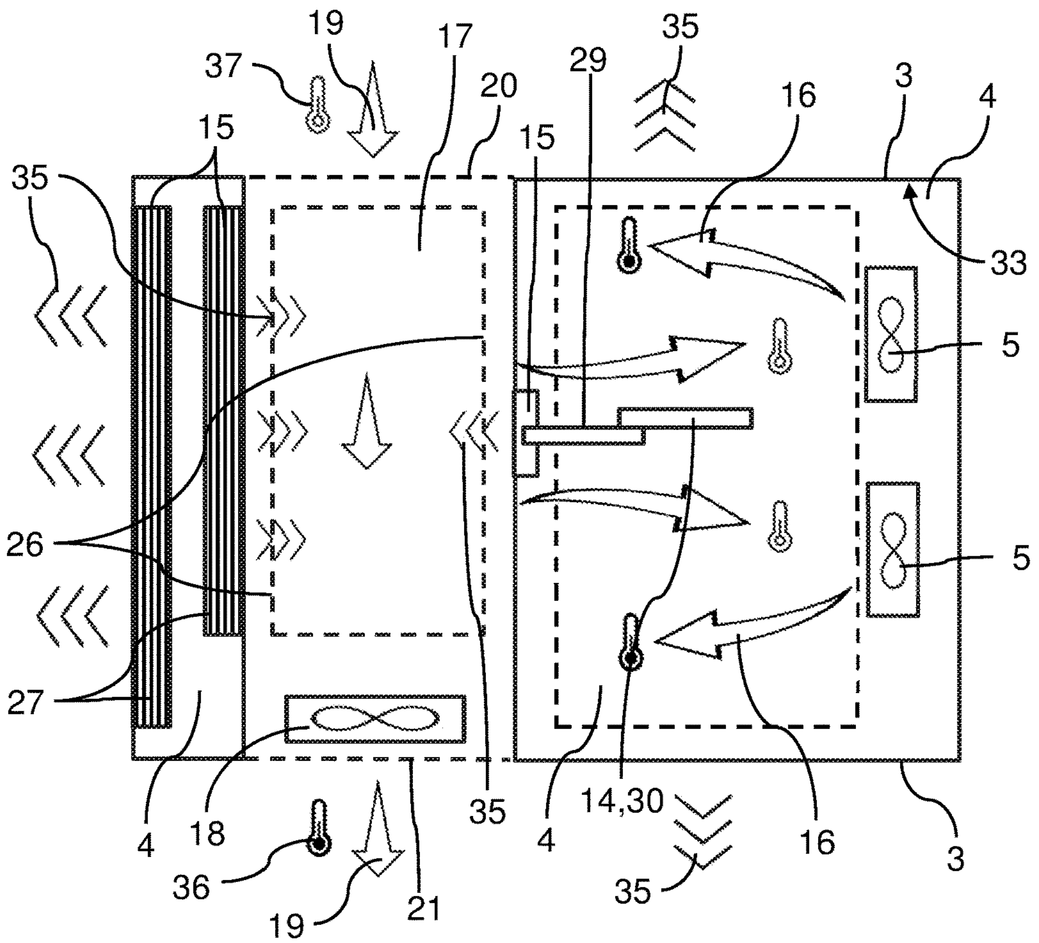
Figure 7:
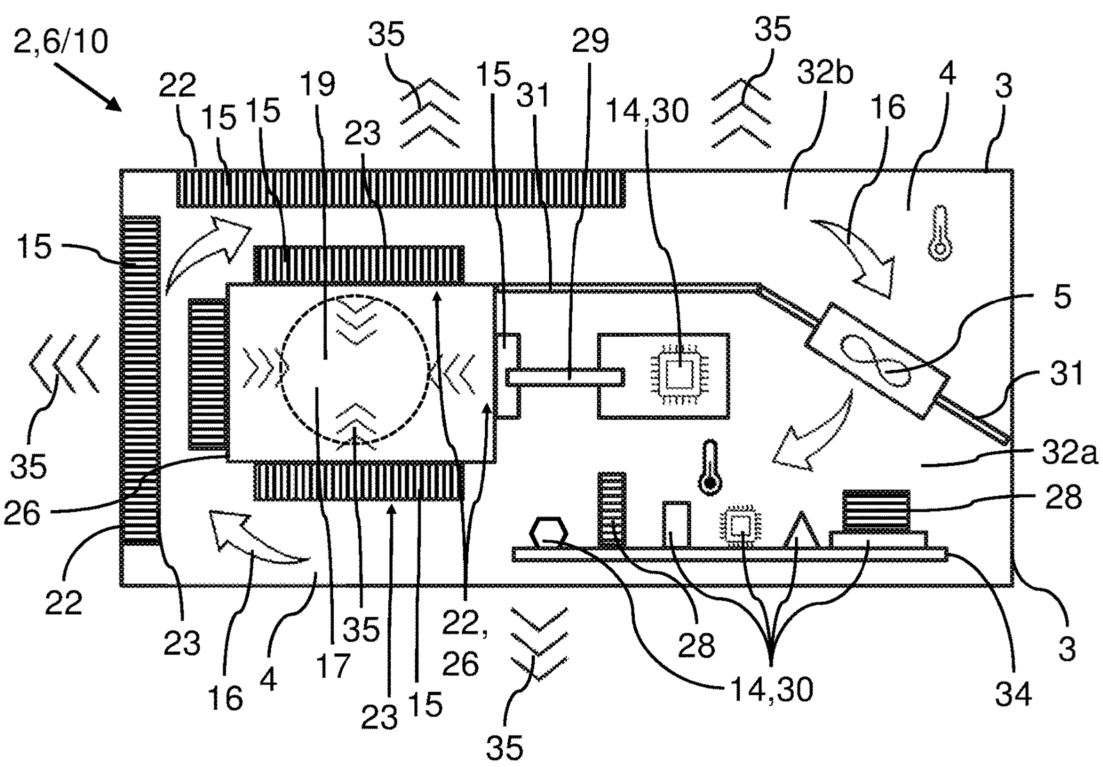
Figure 8:
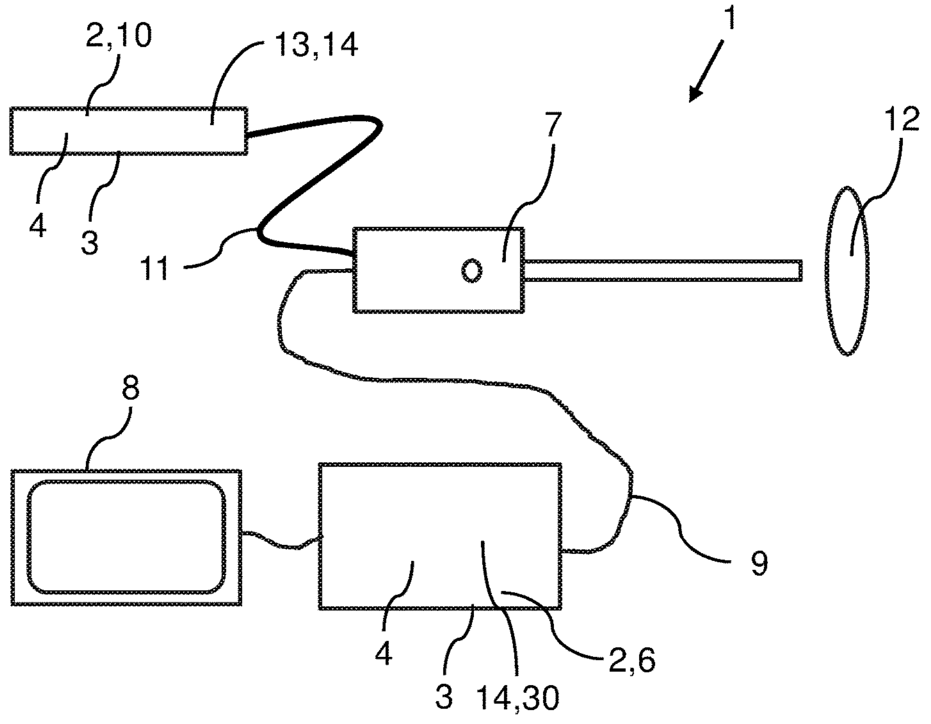

FIG. 1 shows a first example of a system component designed according to the invention, FIG. 2 shows a view from above of the interior of a second system component designed according to the invention, FIG. 3 shows a further example of a system component designed according to the invention, FIG. 4 shows a top view of a system component according to the invention, which has a cooling tunnel, FIG. 5 shows a further example of a system component according to the invention with a cooling tunnel, FIG. 6 shows a further example of a system component according to the invention with a cooling tunnel, wherein a top view is shown, FIG. 7 shows a lateral sectional view through a system component designed according to the invention, which has a cooling tunnel which runs in the horizontal direction (in the viewing direction of the figure), and FIG. 8 shows a schematic view of a medical visualization system having two system components designed according to the invention.

DETAILED DESCRIPTION

FIG. 8 shows an example of a visualization system 1, which comprises an endoscope 7, a monitor 8, and two further components 2, to be specific a camera control unit 6 and a light source unit 10. The light source unit 10 and the camera control unit 6 are respectively designed according to the invention as system components 2 of the visualization system 1 and each have a housing 3, which encloses a respective interior 4. In the case of the light source unit 10, a light source 13 is arranged as a heat source 14 besides electronic components in the interior 4. In the interior 4 of the camera control unit 6, on the other hand, a relatively large electronic circuit board 34 is arranged, on which numerous electronic devices 30 are arranged as heat sources 14.

As shown, the endoscope 7 is used to observe a viewing region 12, wherein a video signal is generated, which is transmitted from the endoscope 7 via a video transmission cable 9 to the camera control unit 6, in order to represent this video image signal on the monitor 8. The endoscope 7 receives the illumination required for imaging from the light source unit 10 via the light guide 11.

During operation, the light source 13 and the electronic devices 30 each generate waste heat, which must be removed to the outside to enable smooth operation of the visualization system 1.

Since both interiors 4 of the system components 2 in FIG. 8 are closed off so as to be substantially air-tight, no relevant amount of dust can penetrate into the respective interior 4 and deposit on the light source 13 or the electronic devices 30. As a result, soiling/contamination of these heat sources 14 and also electrical short circuits can be effectively avoided. If the ingress of dust or pathogens is to be completely prevented, for example seals may be formed in order to be able to close off the interior 4 so as to be completely air-tight to the outside. These approaches according to the invention, however, first have the disadvantage that an ambient air flow can no longer be guided through the interior 4 in order to cool the heat sources 14 located therein directly with ambient air, as has been customary to date in the prior art.

In order to achieve this technical object, the invention proposes the use of an internal fan 5, which is arranged in the closed-off interior 4 of the respective system component 2 as shown in FIGS. 1 to 7. Using the fan 5, an internal air circulation 16, that is to say, a continuous flow of internal air, which circulates in the interior 4, can be effected within the interior 4. This air circulation 16 can glide here over the heat sources 14 arranged in the interior 4, but does not penetrate out of the interior 4 to the outside.

In the example shown in FIG. 1, the configuration of the system component 2 is now exactly such that its housing 3 serves as a primary heat sink 15. The internal air circulation 16, which has absorbed waste heat from the heat sources 14 located in the interior 4, flows to the inner side 23 of the housing 3 and thus transfers the absorbed waste heat over a large area to the housing 3. The outer side 22 of the housing 3 in turn is in contact with the outside/ambient air and can thus release the waste heat from the interior 4 to the surrounding area.

This approach from FIG. 1 is further improved in FIG. 2 by mounting cooling elements 28 in the form of cooling fins on the outer side of the housing 3, i.e. on the outer side of the primary heat sink 15, so that the waste heat can be radiated efficiently into the surrounding area in this region, which means a heat dissipation 35 into the surrounding area.

However, in the example of FIG. 2, an alternative/or complementary approach according to the invention is also illustrated, which could also be used without internal air circulation 16 (in the example of FIG. 2, a fan 5 also being provided, which brings about an internal air circulation 16 in the interior 4). This alternative or complementary approach suggests that a cooling line 29 (heat pipe) filled with coolant is arranged in the interior 4 in order to (directly) cool the at least one heat source 14.

As can be seen in FIG. 2, the cooling line 29 is completely located within the interior 4, which is closed off to the outside and in which a plurality of electronic devices 30 are arranged as heat sources 14. The approximately centrally arranged electronic device 30 (first category) shows a particularly high power loss and is therefore directly thermally coupled/connected to the cooling line 29. The cooling line 29 can therefore transport the waste heat produced by this device 30 to the primary heat sink 15 shown, which is formed by the housing 3 in the example of FIG. 2. The cooling line 29 does not pierce the shown inner wall 33 of the interior 4 at all, but ends in the primary heat sink 15/the housing 3. As illustrated in FIG. 2, the heat transported via the cooling line 29 is ultimately radiated to the surrounding area via the cooling elements 28 mounted on the outer side.

The additional (but not necessarily required) use of the internal air circulation 16 within the interior 4 in the example of FIG. 2 has the advantage that additional waste heat generated by the electronic devices 30 on the circuit board 34 can be transferred efficiently by means of the air circulation 16 to the inner side of the housing 3 and thus to the inner side 23 of the primary heat sink 15 even without separate cooling lines 29. As a result, the available outer side of the housing 3 can release the waste heat generated inside the system component 2 to the surrounding area much more efficiently.

In the example of FIG. 2, it can also be seen that further cooling elements 28 in the form of cooling fins (devices 30 of the second category) are arranged on individual ones of the electronic devices 30 arranged on the electronic circuit board 34. These cooling elements 28 protrude into the interior 4, are (if constructively possible) in each case aligned in the direction of the internal air circulation 16, and can therefore interact with the circulating internal air and heat it. Thereby, the cooling elements 28 transfer the waste heat of the respective device 30 to the internal air circulation 16.

Further, FIG. 2 shows even further electronic devices 30, which make up the majority of the devices 30 on the circuit board 34. However, these devices 30 (of the third category) clearly do not have their own cooling line 29 or any own cooling elements 28, but are impacted only directly by the internal air circulation 16. These devices 30 thus release their waste heat directly to the circulating internal air in the interior 4 without detours. Finally, devices of a fourth category are also arranged on the circuit board 34, which are not impacted by the air circulation 16, but release waste heat to the internal air via heat convection. This waste heat also ends up in the air circulation 16 and is thus also dissipated.

FIG. 3 shows a first possible example of a system component 2 according to the invention, which has its own cooling tunnel 17. As can be seen in FIG. 3, there is thus, besides the internal air circulating in the interior 4, that is to say, the internal air circulation 16, a further air flow, to be specific the ambient air flow 19 flowing through the cooling tunnel 17, with the ambient air flow 19 flowing into the cooling tunnel 17 through the inflow opening 20 shown and flowing out of the outflow opening 21 shown.

The possible details of such a configuration are shown in FIG. 4: The cooling tunnel 17 there has its own primary fan 18 with which the ambient air 19 is conveyed through the cooling tunnel 17. In the process, the ambient air 19 glides over an outer side 22 of the primary heat sink 15 shown, which is arranged for the most part in the interior 4 and thus also has an inner side 23, which can interact with the internal air circulation 16. The outer side 22 of the primary heat sink 15 forms a cooling tunnel wall 26 of the cooling tunnel 17. The waste heat from the heat sources 14, which passes to the primary heat sink 15 either via the cooling line 29 or via the air circulation 16, can thus interact with the ambient air flow 19 in the cooling tunnel 17 after it has been transported to the outer side 22 of the primary heat sink 15 using heat conduction. This waste heat can thus be released to the ambient air flow 19. Correspondingly, FIG. 4 shows that the inflowing ambient air is still comparatively cool (cf. reference sign 37) and has warmed up (possibly noticeably so) after passing through the cooling tunnel 17 (cf. reference sign 36).

In the example shown in FIG. 4, the primary heat sink 15 thus forms a part of the cooling tunnel 17, to be precise a part of said cooling tunnel wall 26. Thus, the primary heat sink 15 is in contact on the outer side with the ambient air 19, but can be impacted on the inner side with the internal air circulation 16. In other words, the inner side 23 of the primary heat sink 15 is therefore arranged in the interior 4, and the outer side 22 of the primary heat sink 15 is arranged just outside the interior 4.

In order to be able to further improve the release of heat from the primary heat sink 15 to the ambient air flow 19, a separate heat exchanger 24 is arranged in the cooling tunnel 17. The heat exchanger 24 offers a multiplicity of honeycombs which are aligned in the flow direction of the ambient air 19, which can thus flow through them, wherein other geometric shapes which likewise provide a low flow resistance but a large surface area for the flow can also be used. This has the technical effect that the heat exchanger 24 provides a substantially higher heat exchange surface 25 than the cooling tunnel wall 26, via which heat can be released to the ambient air flow 19, which flows through the cooling tunnel 17. The heat exchanger 24 is in thermal contact with the outer side 22 of the primary heat sink 15. Thus, the heat exchange surface 25 thus forms the outer side 22 of the primary heat sink 15, because the heat exchanger 24 can also be understood here to be a part of the primary heat sink 15.

As can be seen in FIG. 4, the cooling line 29, which is arranged in the interior 4, is also in thermal connection with the heat exchanger 24 in the cooling tunnel 17, so that the heat transported by the cooling line 29 can also be released directly to the heat exchanger 24. However, the coolant located in the cooling line 29 remains in this case within the interior 4, since the cooling line 29 does not penetrate the interior wall 33 of the interior 4. The heat from the inner side 22 of the primary heat sink 15 and from said cooling line 29 is in each case transferred here to the heat exchanger 24 via heat conduction.

FIG. 4 further shows that the primary heat sink 15 has heat elements 27 in the form of heat fins on the inner side, i.e. on its inner side 23. These heat fins protrude into the interior 4 and thus bring about an increase in surface area in the interior 4. As a result, the internal air can efficiently transfer its heat to the primary heat sink 15, more precisely to the heat elements 27 on the inner side, owing to the internal air circulation 16. The heat elements 27 are also aligned in the direction of the flow of the internal air circulation 16, as can be seen in FIG. 4.

The honeycombs of the heat exchanger 24 can thus also be understood to be cooling elements 28 on the outer side of the primary heat sink 15. However, even without the use of a separate heat exchanger 24, corresponding cooling elements 28 could be formed on the outer side of the primary heat sink 15, which then protrude into the cooling tunnel 17, in order thus to release heat to the ambient air flow 19 flowing through the cooling tunnel 17.

A capillary structure is formed inside the cooling line 29. The former ensures that when the device 30 heats up, the coolant located in the cooling line 29 flows independently through the cooling line 29, thereby transporting waste heat away from the device 30. In the examples of FIGS. 3 and 4, the cooling tunnel 17 was each disposed laterally with respect to the housing 3 of the system component 2. FIGS. 5 and 6, on the other hand, show configurations in which the cooling tunnel 17 is integrated into the housing 3 of the system component 2. Here it would also be conceivable to arrange the cooling tunnel 17 for example vertically so that the ambient air 19 then flows from top to bottom (or in the opposite direction) through the cooling tunnel 17 or through the housing 3, similar to a chimney. As can be seen from FIGS. 5 and 6, in these configurations the respective cooling tunnel 17 is completely enclosed by the internal air circulation 16, that is to say, the air circulation 16 flows around an outer side of the cooling tunnel 17, which is arranged after all in the interior 4. This makes this entire surface available for heat transfer from the internal air to the cooling tunnel 17.

FIG. 6 shows that a plurality of primary heat sinks 15 are arranged in the interior 4, which have fin-type heat elements 27 formed on their inner sides, which are provided for interaction with the internal air circulation 16. The primary heat sink 15 shown in FIG. 6 on the left is thermally coupled to the inner wall 33 of the housing 3 of the system component 2. Accordingly, the waste heat is transported there through the primary heat sink 15 and the housing 3 to the outside.

By contrast, the right-hand heat sink 15, which is likewise arranged in the interior 4, is thermally coupled/connected to the wall 26 of the cooling tunnel 17. The same applies to the further primary heat sink 15, in which the cooling line 29 shown ends. These two primary heat sinks 15 thus pass the waste heat, which they have absorbed via the cooling line 29 or the heat elements 27, on to the cooling tunnel wall 26, and this cooling tunnel wall 26 radiates the waste heat into the cooling tunnel 17, where it is absorbed by the ambient air flow 19 there and transported away; a primary fan 18 is also provided for this purpose, which conveys the ambient air flow 19 through the outflow opening 21. In the example of FIG. 6, to increase the heat dissipation efficiency, a separate heat exchanger 24 could also be arranged in the cooling tunnel 17 to both increase the area of the heat exchange surface 25 within the cooling tunnel 17 and to release the waste heat even more efficiently to the ambient air flow 19 in this way.

In the example of FIG. 7, as already shown in the example of FIG. 4, a configuration is illustrated in which an air guide element 31 is used to steer the internal air circulation 16. More precisely, both in FIG. 4 and in FIG. 7, the interior 4 is divided by means of the air guide element 31 into a first subspace **32*a* and a second subspace 32*b*. In the first subspace 32*a*, numerous electronic devices 30 are present as heat sources 14; in the second subspace 32*b*, by contrast, the inner side 23 of the primary heat sink 15 is arranged, as can be readily seen for instance in the example of FIG. 4. It is also readily conceivable there that by providing the air guide element 31, the flow velocity of the internal air circulation 16 within the second subspace 32*b* is much higher than the flow velocity of the internal air circulation 16, which prevails in the region of the circuit board 34 in the first subspace 32*a*. As a result, the waste heat can be transferred even more efficiently to the fin-type heat elements 27 on the inner side 23 of the primary heat sink 15**.

Thus, the flow velocity can be selectively adapted by appropriately selecting the cross sections of the two subspaces. Depending on the number and shape of the heat sources to be cooled, it may also be useful to selectively reduce the flow velocity in specific regions of the interior 4. This can likewise be achieved by inserting air guide elements and/or by inserting a second fan in the interior 4.

It should also be noted that in both configurations according to FIGS. 4 and 7, the fan 5 located in the interior 4 is inserted into the air guide element 31 and thus conveys the air circulation 16 through the air guide element 31.

It is clear again from the side view shown in FIG. 7 how electronic components/devices 30 of different categories can be cooled with different concepts according to the invention in relation to the power loss: The device 30 of a high power loss, which is arranged above the circuit board 34, is cooled here directly by means of the cooling line 29, which in turn ends in a first primary heat sink 15. Some of the electronic devices 30 of medium power loss (i.e. of the second category), which are arranged on the circuit board 34, have their own cooling elements 28, which interact with the air circulation 16 effected by the internal fan 5. In turn, other devices 30 (of low electrical power loss, that is to say, of the third category) are cooled by contrast directly by the internal air circulation 16 without the use of separate cooling elements 28 and finally, there are devices 30 of a fourth category, which are cooled only by heat convection and heat conduction via the circuit board 34, wherein here, too, waste heat enters the air circulation 16 via heat convection.

The entire waste heat from the electronic circuit board 34 which enters the air circulation 16 is transferred from this air circulation 16 to respective inner sides 23 of a plurality of primary heat sinks 15. These primary heat sinks 15 are, as is shown in FIG. 7, thermally connected either to the housing 3 or to a cooling tunnel wall 26 of a cooling tunnel 17, which extends in the viewing direction in FIG. 7, so that the associated ambient air flow 19 thus flows horizontally through the housing 3. In this example, it is also easy to see that all four sides of the cooling tunnel 17 are arranged in the interior 4 and can thus be used for interaction with respective primary heat sinks 15.

In summary, for increasing the operational reliability of a system component 2 such as a light source unit 10 or a camera control unit 6 of a visualization system 1, the invention thus proposes that waste heat produced by at least one heat source 14, which is arranged in an interior 4 of the system component 2 that is closed off to the outside, preferably so as to be air-tight, is transported by means of a cooling line 29, which is arranged in the interior 4 and is filled with coolant, and/or by using an internal air circulation 16 effected with appropriate means, to a primary heat sink 15 arranged in the interior 4, and that the waste heat is then released from the interior 4 to the outside through the primary heat sink 15 using heat conduction. An efficient cooling of the at least one heat source 14 can thus be achieved; in addition, the heat source 14 remains largely protected from external ambient influences, in particular it remains protected against dust.

LIST OF REFERENCE SIGNS

1 Visualization system
2 System component
3 Housing
4 Interior
5 Fan
6 Camera control unit
7 Endoscope
8 Monitor
9 Video transmission cable
10 Light source unit
11 Light guide
12 Viewing region
13 Light source
14 Heat source
15 Primary heat sink
16 Air circulation
17 Cooling tunnel
18 Primary fan
19 Ambient air flow
20 Inflow opening
21 Outflow opening
22 Outer side
23 Inner side
24 Heat exchanger
25 Heat exchange surface
26 Cooling tunnel wall
27 Heat element
28 Cooling elements
29 Cooling line
30 Devices
31 Air guide element
**32*a*** First subspace
**32*b*** Second subspace
33 Interior wall
34 Electronic circuit board
35 Heat release
36 Heated ambient air
37 Cool ambient air

The invention claimed is:

1. A system component (2) of a visualization system (1), the system component comprising:

at least one heat source (14) generating waste heat during operation;

a housing (3) with an interior (4) in which the at least one heat source (14) is arranged and which is closed off to outside;

a fan (5) is arranged in the interior (4), with which an internal air circulation (16) within the interior (4) is effected;

a primary heat sink (15), which is in contact on an outer side with external ambient air and which is adapted to be impacted on an inner side with the internal air circulation (16), and an inner side (23) of the primary heat sink (15) is arranged in the interior (4) and an outer side (22) of the primary heat sink (15) is arranged outside of the interior (4);

a cooling tunnel (17), which has an inflow opening (20) for introducing ambient air and an outflow opening (21) for discharging the ambient air which has heated up at the primary heat sink (15), and the primary heat sink (15) is formed as part of the cooling tunnel (17);

wherein the internal air circulation (16) is circulating in the interior (4) due to the presence of an air guide element (31); and wherein the cooling tunnel (17) is integrated into the housing (3) and extends through the interior (4) such that the internal air circulation (16) flows around an outer side of the cooling tunnel (17) and the cooling tunnel (17) is completely surrounded by the internal air circulation (16).

2. The system component (2) as claimed in claim 1, wherein the system component (2) is:

a camera control unit (6) and the at least one heat source (14) comprises electronic components, or a light source unit (10) and the at least one heat source (14) comprises at least one light source (13).

3. The system component (2) as claimed in claim 1, wherein the primary heat sink (15) is made of a thermally conductive material.

4. The system component (2) as claimed in claim 1, further comprising a heat exchanger (24) through which the ambient air flows, is formed or arranged in the cooling tunnel (17), and the heat exchanger (24) provides a heat exchange surface (25) for releasing heat to the ambient air that flows through the cooling tunnel (17).

5. The system component (2) as claimed in the claim 4, wherein the heat exchanger (24) is in thermal contact with the primary heat sink (15) so that heat from the primary heat sink (15) is transferable to the heat exchanger (24) by heat conduction.

6. The system component (2) as claimed in claim 1, wherein the primary heat sink (15) has cooling elements (28) on an outer side which are in contact with ambient air and bring about an increase in surface area to radiate heat from the primary heat sink (15) to the ambient air, and the cooling elements (28) on the outer side of the primary heat sink (15) are arranged in the cooling tunnel (17), and are aligned in a direction of an ambient air flow (19) flowing through the cooling tunnel (17).

7. A system component (2) of a visualization system (1), the system component (2) comprising:

at least one heat source (14) generating waste heat during operation;

wherein a housing (3) with an interior (4) in which the at least one heat source (14) is arranged and which is closed off to outside; and at least one cooling line (29) filled with coolant arranged in the interior (4), with which the at least one heat source (14) is coolable;

a primary heat sink (15), an inner side (23) of which delimits the interior (4), the at least one cooling line (29) ends in each case at or in the primary heat sink (15);

wherein the at least one cooling line (29) does not completely penetrate a wall (33) of the interior (4) into a surrounding area;

the primary heat sink (15) is in contact on an outer side with external ambient air, and the inner side (23) of the primary heat sink (15) is arranged in the interior (4) and an outer side (22) of the primary heat sink (15) is arranged outside of the interior (4);

a cooling tunnel (17), which has an inflow opening (20) for introducing ambient air and an outflow opening (21) for discharging the ambient air which has heated up at the primary heat sink (15), and the primary heat sink (15) is formed as part of the cooling tunnel (17); and wherein the cooling tunnel (17) is integrated into the housing (3) and extends through the interior (4) such that internal air in the interior of the housing flows around an outer side of the cooling tunnel (17) and the cooling tunnel (17) is surrounded in the housing by the internal air.

8. The system component (2) as claimed in claim 7, further comprising heat elements (27) on the inner side of the primary heat sink (15) which protrude into the interior (4) increase a surface area of the heat sink.

9. The system component (2) as claimed in claim 7, wherein at least one of a) the the heat source comprises at least one electronic device (30) which is arranged in the interior (4) and is thermally connected to an inner side (23) of the primary heat sink (15) by at least one cooling line (29) filled with coolant, or b) a capillary structure is formed in an interior of the at least one cooling line (29), such that when the at least one electronic device (30) heats up, the coolant flows independently through the cooling line (29) such that waste heat of at least one of the at least one electronic device (30) is transported to the primary heat sink (15).

10. The system component (2) as claimed in claim 7, wherein the system component (2) comprises at least one electronic device (30), which is arranged in the interior (4) and on which at least one cooling element (28) which protrudes into the interior (4) is mounted.

11. The system component (2) as claimed in claim 7, wherein the system component (2) comprises at least one electronic device (30) which is located in the interior (4), and an internal air circulation (16) impacts the at least one electronic device (30).

12. The system component (2) as claimed in claim 11, further comprising at least one air guide element (31) arranged in the interior (4), said air guide element (31) protrudes into the interior (4) and at least one of steers or accelerates the inner air circulation (16) in a direction of the primary heat sink (15), the at least one air guide element (31) divides the interior (4) into first and second subspaces (32*a*, 32*b*), and the at least one electronic device (30) is located in the first subspace (32*a*) within the interior (4) and the inner side (23) of the primary heat sink (15) is arranged in the second subspace (32*b*) within the interior (4).

13. The system component (2) as claimed in claim 11, wherein the interior (4) is divided into first and second subspaces (32*a*, 32*b*) which are connected to each other via the air circulation (16) such that a second flow velocity of the internal air circulation (16) is present in the second subspace (32*b*), in which the inner side (23) of the primary heat sink (15) is arranged, which is higher than a first flow velocity of the internal air circulation (16) in the first subspace (32*a*), in which a plurality of the heat sources (14) to be cooled are located.

14. A method for indirectly cooling at least one heat source (14) of a system component (2) of a visualization system (1), the method comprising:

closing off an interior (4) of the system component (2), in which at least one heat source (14) is arranged;

generating an internal air circulation (16) that circulates only within the closed-off interior (4); and transporting waste heat via the internal air circulation (16) from the at least one heat source (14) to an inner side (23) of a primary heat sink (15), with the inner side (23) arranged in the interior (4);

wherein the primary heat sink (15) forms part of a cooling tunnel (17), which has an inflow opening (20) for introducing ambient air and an outflow opening (21) for discharging the ambient air which has heated up at the primary heat sink (15), and the primary heat sink (15) is formed as part of the cooling tunnel (17);

wherein the internal air circulation (16) is circulating in the interior (4) due to an air guide element (31); and the cooling tunnel (17) is integrated into the housing (3) and extends through the interior (4) such that the internal air circulation (16) flows around an outer side of the cooling tunnel (17) and the cooling tunnel (17) is completely surrounded by the internal air circulation (16) within the housing (4).

15. A method for indirectly cooling at least one heat source (14) of a system component (2) of a visualization system (1), the method comprising:

closing off an interior (4) of the system component (2), in which at least one heat source (14) is arranged;

removing waste heat from the at least one heat source (14) via a cooling line (29) filled with coolant only up to a primary heat sink (15); and removing the waste heat from the closed-off interior (4) to outside via the primary heat sink (15) using heat conduction;

wherein the primary heat sink (15) forms part of a cooling tunnel (17), which has an inflow opening (20) for introducing ambient air and an outflow opening (21) for discharging the ambient air which has heated up at the primary heat sink (15), and the primary heat sink (15) is formed as part of the cooling tunnel (17);

wherein the internal air circulation (16) is circulating in the interior (4) due to an air guide element (31); and the cooling tunnel (17) is integrated into the housing (3) and extends through the interior (4) such that the internal air circulation (16) flows around an outer side of the cooling tunnel (17) and the cooling tunnel (17) is completely surrounded by the internal air circulation (16) within the housing (4).

16. The method of claim 15, wherein the heat source comprises a multiplicity of electronic devices (30) which are located in the interior (4) of the system component (2) which is closed off to be air-tight.

* * * * *